United States Patent
Sritulanont et al.

(10) Patent No.: US 6,475,826 B1
(45) Date of Patent: Nov. 5, 2002

(54) METHOD AND SYSTEM FOR DETECTION OF INTEGRATED CIRCUIT PACKAGE ORIENTATION IN A TAPE AND REEL SYSTEM

(75) Inventors: Somboon Sritulanont, Nonthaburi (TH); Wattanapong Viriya, Mahasarakam (TH); Amorn Hongmala, Phattalung (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/632,498

(22) Filed: Aug. 3, 2000

(51) Int. Cl.[7] .......................... H01L 21/44; H01L 21/48; H01L 21/80
(52) U.S. Cl. .......................... 438/106; 438/12; 438/16; 438/17
(58) Field of Search ........................ 438/106, 10, 12, 438/15, 16, 17, 18; 250/225, 559.34, 559.45, 559.46

(56) References Cited

U.S. PATENT DOCUMENTS 5,844,249 A * 12/1998 Takano et al. ......... 250/559.34
6,210,984 B1 * 4/2001 Farnworth et al. ............ 438/15

* cited by examiner

Primary Examiner—David Nelms
Assistant Examiner—Reneé R. Berry
(74) Attorney, Agent, or Firm—Sawyer Law Group LLP

(57) ABSTRACT

Aspects for detecting integrated circuit package orientation in carrier tape packing are described. In accordance with these aspects, a digital circuit is provided over a carrier rail of a tape and reel system. The digital circuit detects package orientation based on a chamfer side of packages within a tape on the carrier rail. The digital circuit further includes at least two optical sensors, where the optical sensors emit a light beam and sense reflection of the light beam for each package within the tape for use in determining package orientation in an automated manner.

12 Claims, 4 Drawing Sheets

FIG. 4

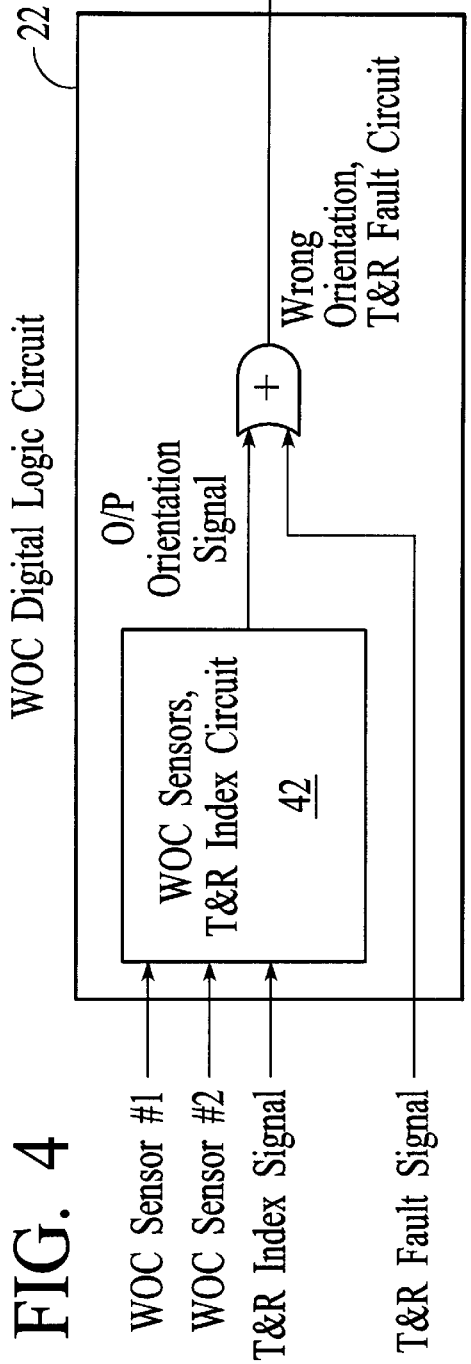

FIG. 5

| WOC Sensor #1 | WOC Sensor #2 | O/P | Condition |
|---|---|---|---|
| No Reflection | No Reflection | Orientation failure | Wrong 180° orientation |
| No Reflection | Reflection | Orientation failure, or malfunction | Wrong 90° orientation, or sensor failure |
| Reflection | No Reflection | Orientation failure, or malfunction | Wrong 270° orientation, or sensor failure |
| Reflection | Reflection | Pass | Correct orientation, or empty pocket |

METHOD AND SYSTEM FOR DETECTION OF INTEGRATED CIRCUIT PACKAGE ORIENTATION IN A TAPE AND REEL SYSTEM

FIELD OF THE INVENTION

The present invention relates to the packing of integrated circuits in tape and reel packaging, and more particularly to ensuring packing in a proper orientation.

BACKGROUND OF THE INVENTION

In the manufacture of large-scale integrated circuit devices, it is necessary to package the devices in a way which minimizes handling, and which minimizes potential damage to the devices, particularly to the device leads. For customers requiring large numbers of identical devices, the integrated circuit devices frequently are packaged in elongated strips of sealed "pocket tape." Such pocket tape normally comprises a carrier tape made of a flexible plastic material in which a series of adjacent pockets are formed. The pocket size is selected to accommodate correspondingly-sized integrated circuit packages, with one package being placed in each pocket. The pockets are arranged to run the length of the carrier tape, which also typically includes perforated flanges along each edge of the tape for utilization in indexing machines, where the devices subsequently are removed from the carrier tape.

At the manufacturer of the devices, the carrier tape is moved along while the devices are inserted, and then a releasable cover tape is sealed to the carrier tape along the edges of the different pockets to hold the devices in the pockets. After this is done, the sealed pocket tape is rolled up on reels for delivery. The orientation of the packages in the pockets of the reels follows according to specifications of the particular device package. Normally, inspection of the orientation of the packages in the pockets of the carrier tape involves visual monitoring by an operator, which is prone to human error.

Accordingly, a need exists for package orientation detection for tape and reel packing operations that is automated and more reliable than human, visual inspection.

The present invention meets this need.

SUMMARY OF THE INVENTION

Aspects for detecting integrated circuit package orientation in carrier tape packing are described. In accordance with these aspects, a digital circuit is provided over a carrier rail of a tape and reel system. The digital circuit detects package orientation based on a chamfer side of packages within a tape on the carrier rail. The digital circuit further includes at least two optical sensors, where the optical sensors emit a light beam and sense reflection of the light beam for each package within the tape for use in determining package orientation in an automated manner.

With the aspects of the present invention, orientation checking for tape and reel systems is improved through automated checking mechanisms that result in less chance for human error in identifying wrongly oriented packages in tape pockets. These and other advantages of the present invention will be more fully understood in conjunction with the following detailed description and accompanying drawings.

BRIEF DESCRIPTION OF THE FIGURES

FIG. 4 illustrates a block diagram of a logic circuit for the orientation checker of the present invention.

FIG. 5 illustrates a table of logical states for signals and interpretations for the orientation checker of the present invention.

DETAILED DESCRIPTION

The present invention relates to integrated circuit package orientation detection in a tape and reel system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

It should be appreciated that the present invention is discussed with particular application for detection of packages in the wrong orientation for packages with a chamfer side on the pin 1 ID marking side of the device, such as PLCC (plastic leaded chip carrier) packages. This is meant as illustrative of a preferred embodiment of the present invention.

Figure 1:
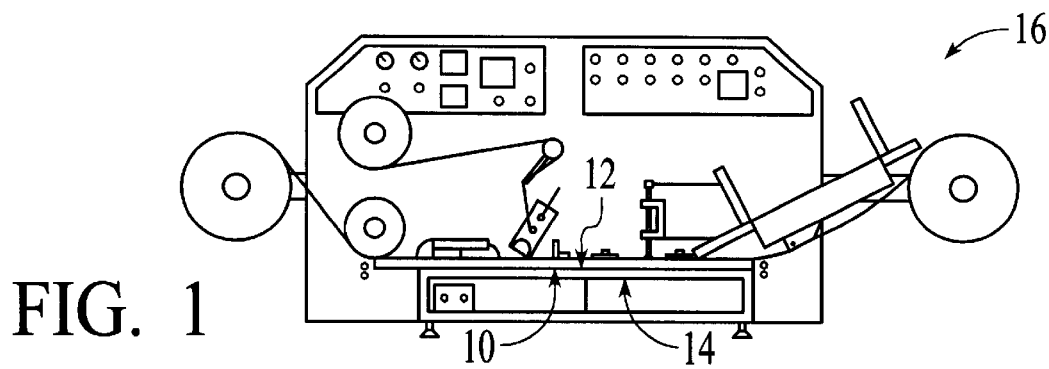
FIG. 1 illustrates an overall system diagram of a tape and reel system with an orientation checker in accordance with the present invention.
Figure 2:
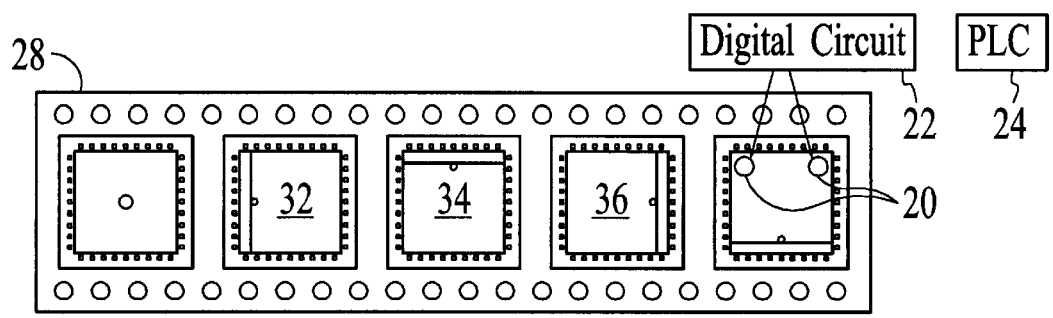
FIG. 2 illustrates a diagram of carrier tape being checked by the orientation checker in accordance with the present invention.

In accordance with the present invention, an orientation checker 10 is provided on a carrier tape guide rail 12 above the carrier tape holding the devices/units and before the sealing assembly 14 for a tape and reel systemation model 16, such as models ST-50 and ST-490 from RVSI-Systemation Manufacturing, as shown in FIG. 1. As presented with reference to FIG. 2, the orientation checker 10 (FIG. 1) includes two optic fiber sensors 20, where each sensor 20 both emits and receives a light beam, and a wrong orientation checker (WOC) digital logic circuit 22. Examples of suitable sensors 20 include fiber unit keyence model FU-35FA with focusing lens, keyence model F-2HA, and fiber optic sensor keyence model FS-T1. The WOC circuit 22 interfaces between the sensors 20 and a standard PLC (programmable logic circuit) control 24 of the tape & reel machine. In operation, the sensors 22 emit a light beam which reflects off the surfaces of the packages 26 indexing in a carrier tape 28. With the use of two optic fiber sensors 20, three potentially incorrect orientation positions 32, 34, or 36 of the square packages are able to be screened, even if one of the sensors 20 should malfunction, as described more fully hereinbelow.

Figure 3:
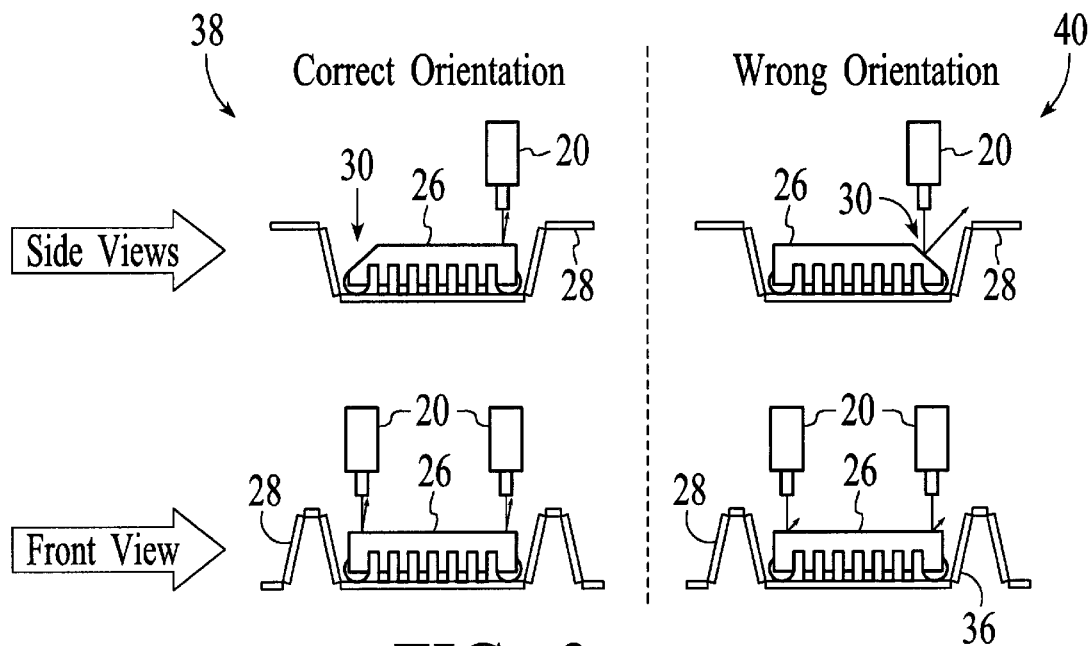
FIG. 3 illustrates correct and incorrect orientation detection by the orientation checker of the present invention.

FIG. 3 illustrates views 38 and 40 for detection by the sensor 20 of a correct package orientation (view 38) and an incorrect package orientation (view 40). From view 38, the sensors 20 detect reflection of the emitted light beam off of package 26 toward the sensors 20. In contrast, in view 40, the beam reflects off a chamfered side 30 of the package 26 and reflects away from the sensor's 20 receiver, thus interrupting the sensor's signal.

Figure 6:
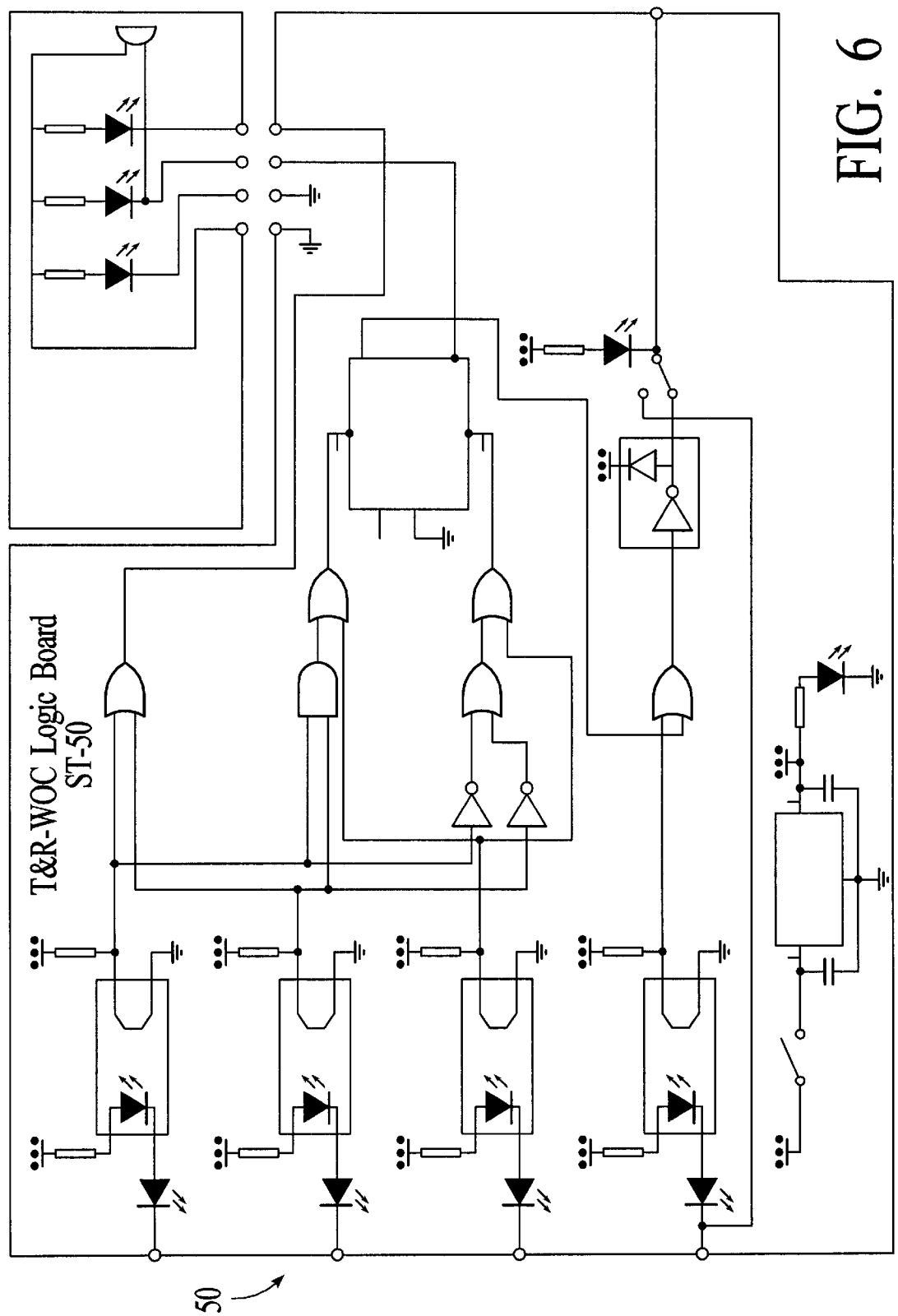
FIGS. 6 and 7 illustrate examples of circuit diagrams for the logic circuit of FIG. 4.
Figure 7:
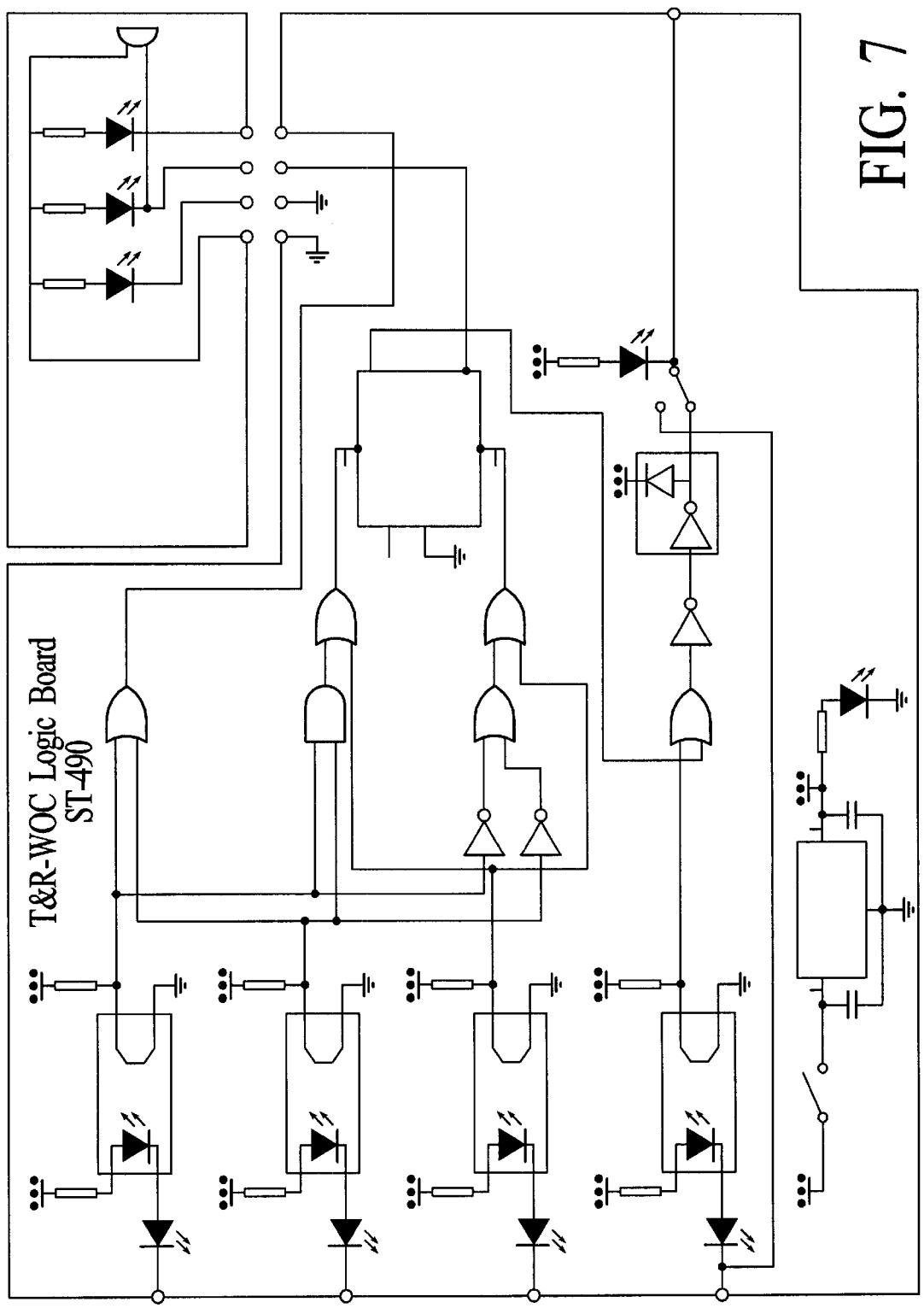

The WOC circuit 22 interprets interrupted signals as a package 26 in a wrong orientation. The WOC circuit 22 then sends a wrong orientation signal to the PLC 24 of the tape and reel machine in order to stop the machine and alert the malfunction, e.g., to activate an alarm. FIG. 5 illustrates a table diagram of sensor signals, with the output (O/P) that is indicated based on the sensor 20 signals, and the condition that the O/P signal indicates for the WOC circuit 22. As the table indicates, with no reflection detected in either or both of the sensors 20, the three incorrect orientations 32, 34, and 36 (FIG. 2), are readily detected. Referring to FIG. 4, a circuit 42 logically combines the sensor signals, WOC sensor #1 and WOC sensor #2, and an index signal for a current package being checked, T&R Index signal, to produce the O/P orientation signal. The O/P orientation signal is then logically combined, e.g., ORed, with an existing fault signal mechanism in the system, T&R Fault signal, to provide the fault signal from the WOC circuit 22. Of course, since tape and reel machines may use either high (1) or low (0) level digital signals, the logic needed for forming circuit 22 is designed according to those system needs, as is well appreciated by those skilled in the art. By way of example, FIG. 6 illustrates a circuit diagram 50 suitable as orientation checker logic circuit 22 for an ST-50 tape and reel systemation model, while FIG. 7 illustrates a circuit diagram 52 suitable as orientation checker logic circuit 22 for an ST-490 tape and reel systemation model.

With the aspects of the present invention, orientation checking for tape and reel systems is improved. The utilization of fiber optic sensors and digital logic provide automated checking mechanisms that result in less chance for human error in identifying wrongly oriented packages in tape pockets. Further, while increasing reliability, the automated nature saves time over traditional, manual, human visual inspection approaches.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting integrated circuit package orientation in carrier tape packing, the method comprising:

providing a digital circuit over a carrier rail of a tape and reel system; and utilizing the digital circuit to detect package orientation based on a chamfer side of packages within a tape on the carrier rail.

2. The method of claim 1 wherein providing a digital circuit further comprises providing at least two optical sensors.

3. The method of claim 2 wherein utilizing the digital circuit further comprises utilizing the at least two optical sensors to emit a light beam and sense reflection of the light beam for each package within the tape.

4. The method of claim 3 wherein providing a digital circuit further comprises providing logic means coupled to the optical sensors to interpret signals from the at least two optical sensors.

5. The method of claim 4 wherein utilizing the digital circuit further comprises determining an incorrect orientation of a package when at least one of the at least two optical sensors sense no light beam reflection for the package.

6. The method of claim 4 wherein utilizing the digital circuit further comprises determining a correct orientation of a package when the at least two optical sensors both sense light beam reflection from the package.

7. The method of claim 1 wherein providing a digital circuit further comprises providing the digital circuit before a sealing assembly of the tape and reel system.

8. A method for detecting package orientation of integrated circuit devices in a tape and reel system, the method comprising:

positioning an orientation checker above a carrier tape holding a plurality of integrated circuit devices; and optically determining an orientation of each integrated circuit device automatically with the orientation checker prior to sealing the integrated circuit devices in the carrier tape with a sealing assembly.

9. The method of claim 8 wherein optically determining further comprises utilizing at least two optical sensors to detect a chamfer side of each integrated circuit device.

10. The method of claim 9 wherein optically determining further comprises detecting a proper orientation of an integrated circuit device when each optical sensor detects a reflection from a light beam emitted on the integrated circuit device.

11. The method of claim 10 wherein the integrated circuit device further comprises an integrated circuit device packaged as a plastic leaded chip carrier device.

12. The method of claim 8 wherein positioning further comprises coupling the orientation checker to a guide rail for the carrier tape.

* * * * *